(12) United States Patent
Wu

(10) Patent No.: US 10,693,060 B2
(45) Date of Patent: Jun. 23, 2020

(54) PHASE CHANGE MEMORY STRUCTURE AND THE SAME

(71) Applicant: TAIWAN SEMICONDUCTOR MANUFACTURING COMPANY LTD., Hsinchu (TW)

(72) Inventor: Jau-Yi Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 134 days.

(21) Appl. No.: 15/964,900

(22) Filed: Apr. 27, 2018

(65) Prior Publication Data

US 2019/0334083 A1 Oct. 31, 2019

(51) Int. Cl.
*H01L 23/58* (2006.01)
*H01L 45/00* (2006.01)
*G11C 13/00* (2006.01)

(52) U.S. Cl.
CPC .......... *H01L 45/06* (2013.01); *G11C 13/0004* (2013.01); *H01L 45/122* (2013.01); *H01L 45/126* (2013.01); *H01L 45/145* (2013.01); *H01L 45/148* (2013.01)

(58) Field of Classification Search
CPC . H01L 2924/00014; H01L 2224/13111; H01L 2924/00012; H01L 2224/18; H01L 2224/2919; H01L 2224/94; H01L 25/18; H01L 2224/13147; H01L 2224/73204; H01L 2224/83104; H01L 23/49816; H01L 23/50; H01L 27/2463; H01L 45/04; H01L 45/1233; H01L 2224/0345; H01L 2224/03452; H01L 2224/05572; H01L 2224/11; G11C 11/1673; G11C 11/1675; G11C 13/0004; G11C 11/1659; G11C 13/004; G11C 11/161; G11C 11/1655; G11C 11/1657; G11C 13/0069; G11C 16/30; G11C 11/5607; G11C 13/0026; G11C 13/0028; H03K 19/1776; H03K 3/037; H03K 19/1737; H03K 19/17728; H03K 19/20; H03K 19/21; H03K 17/14; H03K 17/30; H03K 17/687; H03K 17/9535; H03K 17/955; H03K 19/0002; H03K 19/003; H03K 19/0948; H03K 19/177; H03K 19/17724; H03K 2217/0036; H03K 3/356008; H03K 3/356139; H03K 3/356191; H03K 5/22; H03K 7/08
See application file for complete search history.

(56) References Cited

U.S. PATENT DOCUMENTS

| | | | | |
|---|---|---|---|---|
| 2004/0164290 | A1* | 8/2004 | Yi | H01L 45/06 257/4 |
| 2005/0285094 | A1* | 12/2005 | Lee | H01L 27/2409 257/2 |
| 2006/0077741 | A1* | 4/2006 | Wang | G11C 11/56 365/222 |

(Continued)

*Primary Examiner* — Robert G Bachner
(74) *Attorney, Agent, or Firm* — WPAT, P.C. Intellectual Property Attorneys; Anthony King

(57) ABSTRACT

The present disclosure provides a phase change memory structure, including a bottom electrode, a first phase change material contacting a top surface of the bottom electrode, a first switch over the first phase change material, a second phase change material over the first switch, and a top electrode over the second phase change material.

20 Claims, 15 Drawing Sheets

(56) References Cited

U.S. PATENT DOCUMENTS

| | | | |
|---|---|---|---|
| 2009/0095985 A1* | 4/2009 | Lee .................... | G11C 13/0007 257/211 |
| 2012/0225534 A1* | 9/2012 | Lee .................... | H01L 45/1675 438/382 |
| 2014/0151622 A1* | 6/2014 | Oyanagi ............. | H01L 45/1233 257/2 |
| 2017/0117328 A1* | 4/2017 | Terai ................... | H01L 27/2481 |
| 2017/0250222 A1* | 8/2017 | Wu ........................ | H01L 45/06 |

* cited by examiner

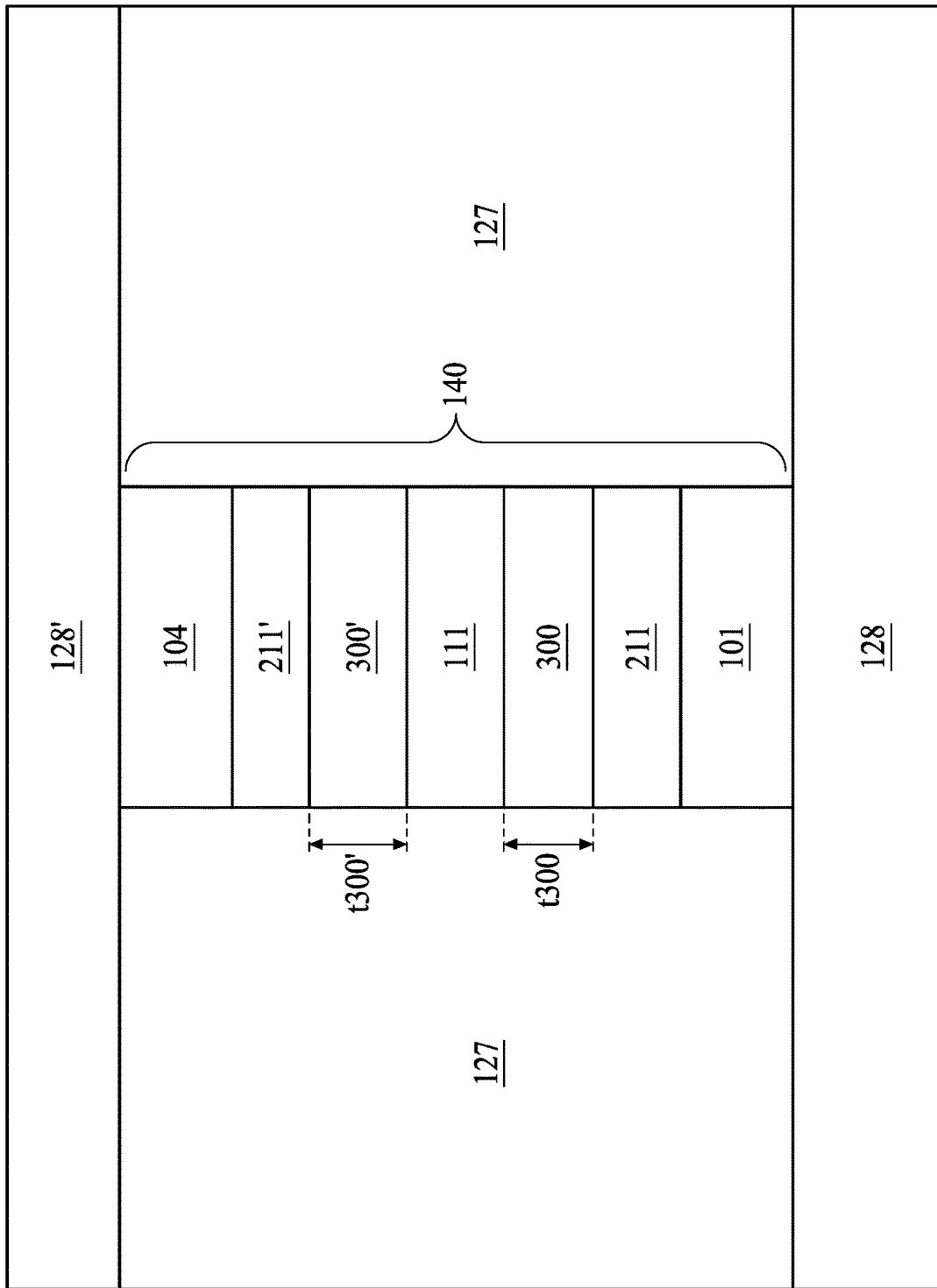

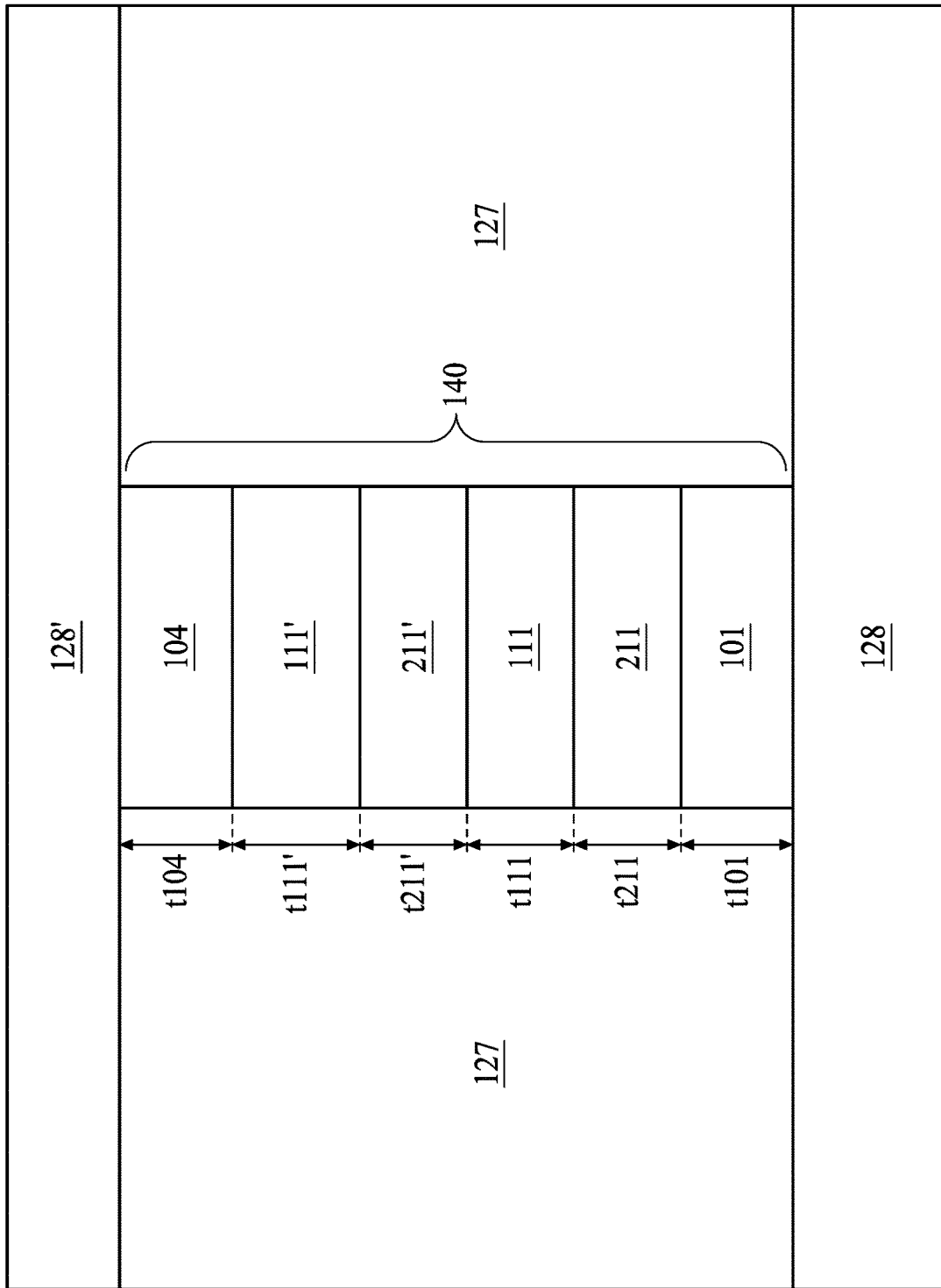

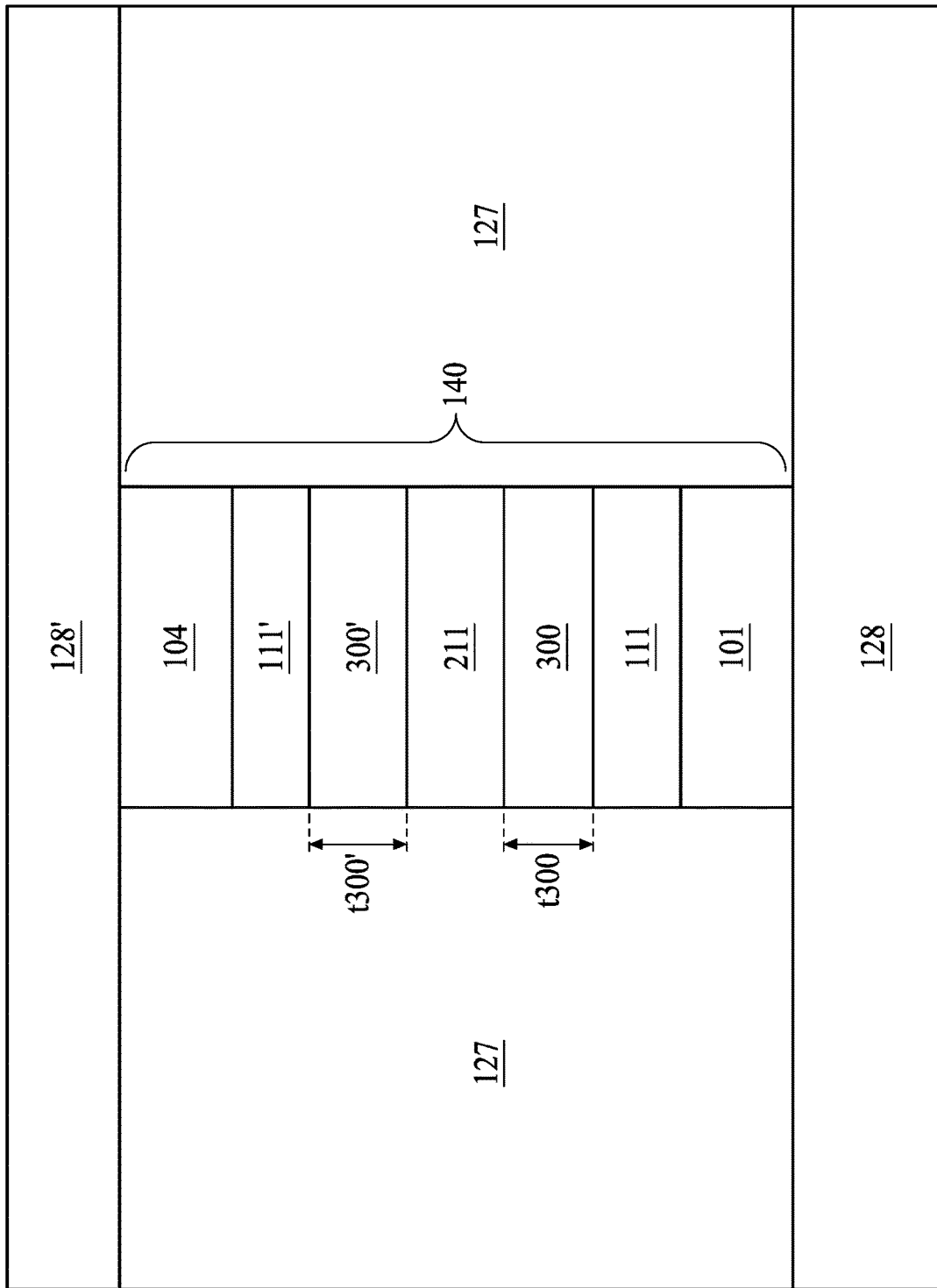

PHASE CHANGE MEMORY STRUCTURE AND THE SAME

BACKGROUND

Phase change technology is promising for next generation memories. It uses chalcogenide semiconductors for storing states. The chalcogenide semiconductors, also called phase change materials, have a crystalline state and an amorphous state. In the crystalline state, the phase change materials have a low resistivity, while in the amorphous state they have a high resistivity. The resistivity ratios of the phase change materials in the amorphous and crystalline states are typically greater than 1000 and thus the phase change memory devices are unlikely to have erroneous reading. The chalcogenide materials are stable at certain temperature ranges in both crystalline and amorphous states and can be switched back and forth between the two states by electric pulses. One type of memory device that uses the principal of phase change in chalcogenide semiconductors is commonly referred to as phase change random access memory (PCRAM).

PCRAM has several operating and engineering advantages, including high speed, low power, non-volatility, high density, and low cost. For example, PCRAM devices are non-volatile and may be written into rapidly, for example, within less than about 50 nanoseconds. The PCRAM cells may have a high density. In addition, PCRAM memory cells are compatible with CMOS logic and can generally be produced at a low cost compared to other types of memory cells.

Phase change material is formed between top electrode and bottom electrode contact. In a reset operation, phase change material may be heated up to a temperature higher than the melting temperature when a current passes through it. The temperature is then quickly dropped below the crystallization temperature. A portion of the phase change material is changed to an amorphous state with a high resistivity, thus the state of the PCRAM cell is changed to a high-resistance state. Region can be set back to the crystalline state by heating up the phase change material to a temperature higher than the crystallization temperature, but below the melting temperature, for a certain period.

Conventional phase change memory structure includes a phase change material, an ovonic threshold switch, a middle electrode, a top electrode, and a bottom electrode between adjacent oxide layers. However, in order to combine material properties of a plurality of phase change materials or ovonic threshold switches, one would combine several phase change structure, that is, the plurality of phase change materials or ovonic threshold switches would be disposed at different layers, with oxide layers spacing in-between. Thus the thickness of the whole phase change structure became thicker.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C is a cross section of a phase change memory structure, in accordance with some embodiments of the present disclosure.

FIG. 3A is a cross section of a phase change memory structure, in accordance with some embodiments of the present disclosure.

FIG. 4C is a cross section of a phase change memory structure, in accordance with some embodiments of the present disclosure.

DETAILED DESCRIPTION

Figure 1:
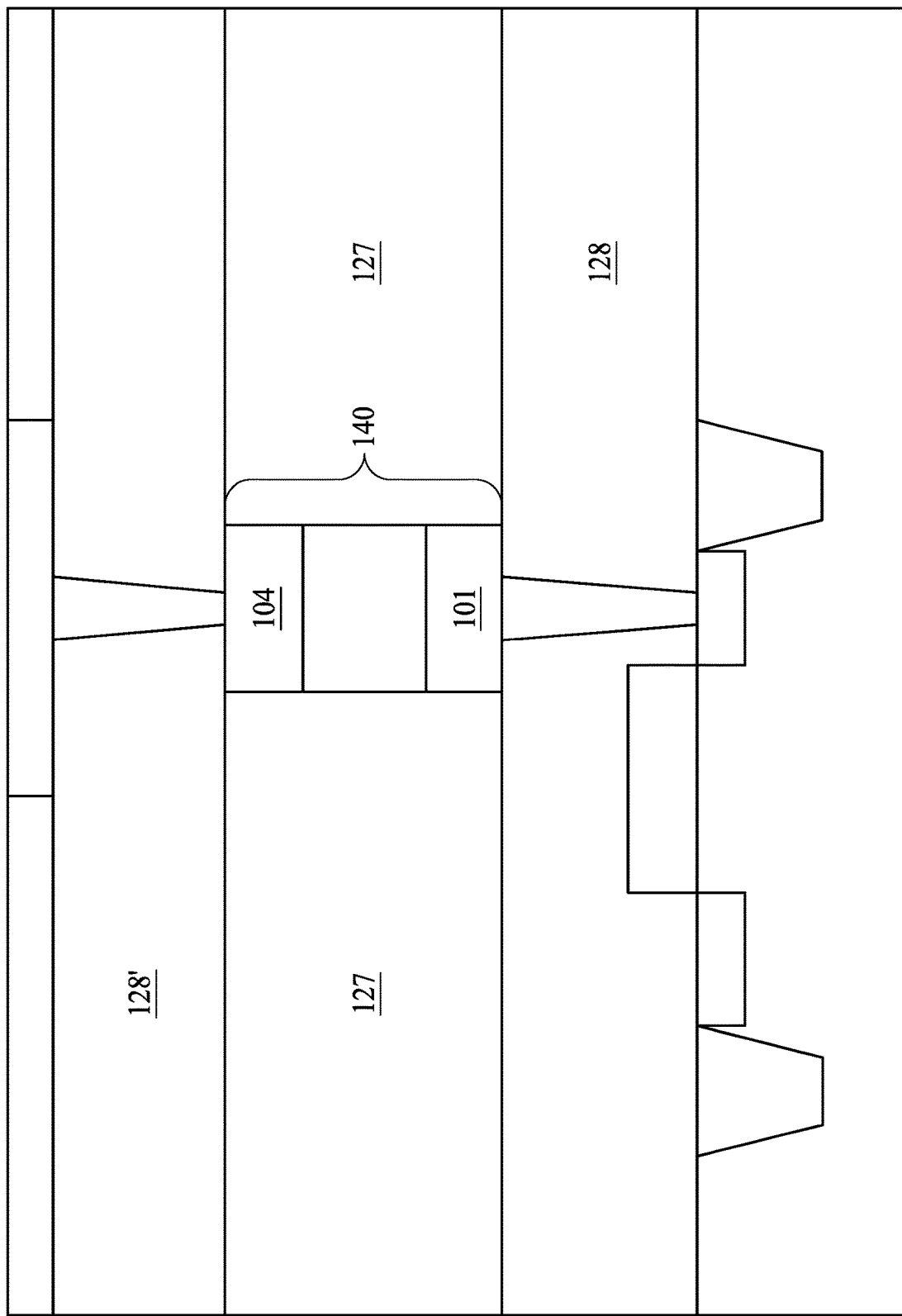
FIG. 1 is a cross section of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting; forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Conventionally, only one switch and one phase change memory material are disposed in one phase change memory cell. Along the path of threshold voltage reduction, thickness of the switch has to be made thinner to an extent that triggers substantial leakage current. Therefore, directly reducing the thickness of the switch to lower the threshold voltage is at the expense of increasing the leakage current. In addition, having only one phase change material in one phase change memory cell faces higher threat for memory cell failure due to the fact that retention lost is a random process. For instance, if the only phase change material fails during operation, the entire memory cell is counted as a failed cell.

Present disclosure provides a phase change memory cell structure having a versatile threshold voltage tuning design and a low memory cell failure rate. By having at least two switches arranged in series in one phase change memory cell, the properties of the phase change memory structure, such as leakage current or threshold voltage, can be easily tuned by tailoring various kinds of materials and thicknesses of switches. Meanwhile by having two phase change materials arranged in series could greatly reduce failure rate of the phase change memory structure.

Referring to FIG. 1, FIG. 1 is a cross section of a semiconductor structure 100, in accordance with some embodiments of the present disclosure. The semiconductor structure 100 includes at least one phase change memory stack 140. In some embodiments, the phase change memory stack 140 includes a top electrode 104 at a top portion of the phase change memory stack 140, and a bottom electrode 101 at a bottom portion of the phase change memory stack 140. The phase change memory stack 140 may be surrounded by a dielectric layer 127. The phase change memory stack 140 is disposed between an $N^{th}$ inter layer dielectric (hereinafter $N^{th}$ ILD) 128 and an $(N+1)^{th}$ inter layer dielectric (herein-after $(N+1)^{th}$ ILD) 128'. Herein N is an integer greater than or equal to 1. In some embodiments, a top surface of the top electrode 104 contacts with the $(N+1)^{th}$ ILD 128'. In some embodiments, a bottom surface of the bottom electrode 101 contacts with the $N^{th}$ ILD 128. In some embodiments, the $N^{th}$ ILD 128 and the $(N+1)^{th}$ LID 128' may be formed from a variety of dielectric materials and may, for example, include oxide, nitride, silicide, carbide, metal, or the like. In some embodiments, the $N^{th}$ ILD 128 and the $(N+1)^{th}$ ILD 128' may include metal layers surrounded by the aforesaid dielectric materials, The metal layer referred herein includes metal lines and metal vias composed of copper or copper alloy. Metal lines and metal vias in different metal layers form an interconnect structure composed of substantially pure copper (for example, with a weight percentage of copper being greater than about 90 percent, or greater than about 95 percent) or copper alloys, and may be formed using the single and/or dual damascene processes. Metal lines and metal vias may be, or may not be, substantially free from aluminum. Interconnect structure includes a plurality of metal layers. In some embodiments, one or more metal lines in the $(N+1)^{th}$ ILD 128' may be connected to the top electrode 104. In some embodiments, one or more metal lines in the $N^{th}$ ILD 128 may be connected to the bottom electrode 101.

Figure 2A:
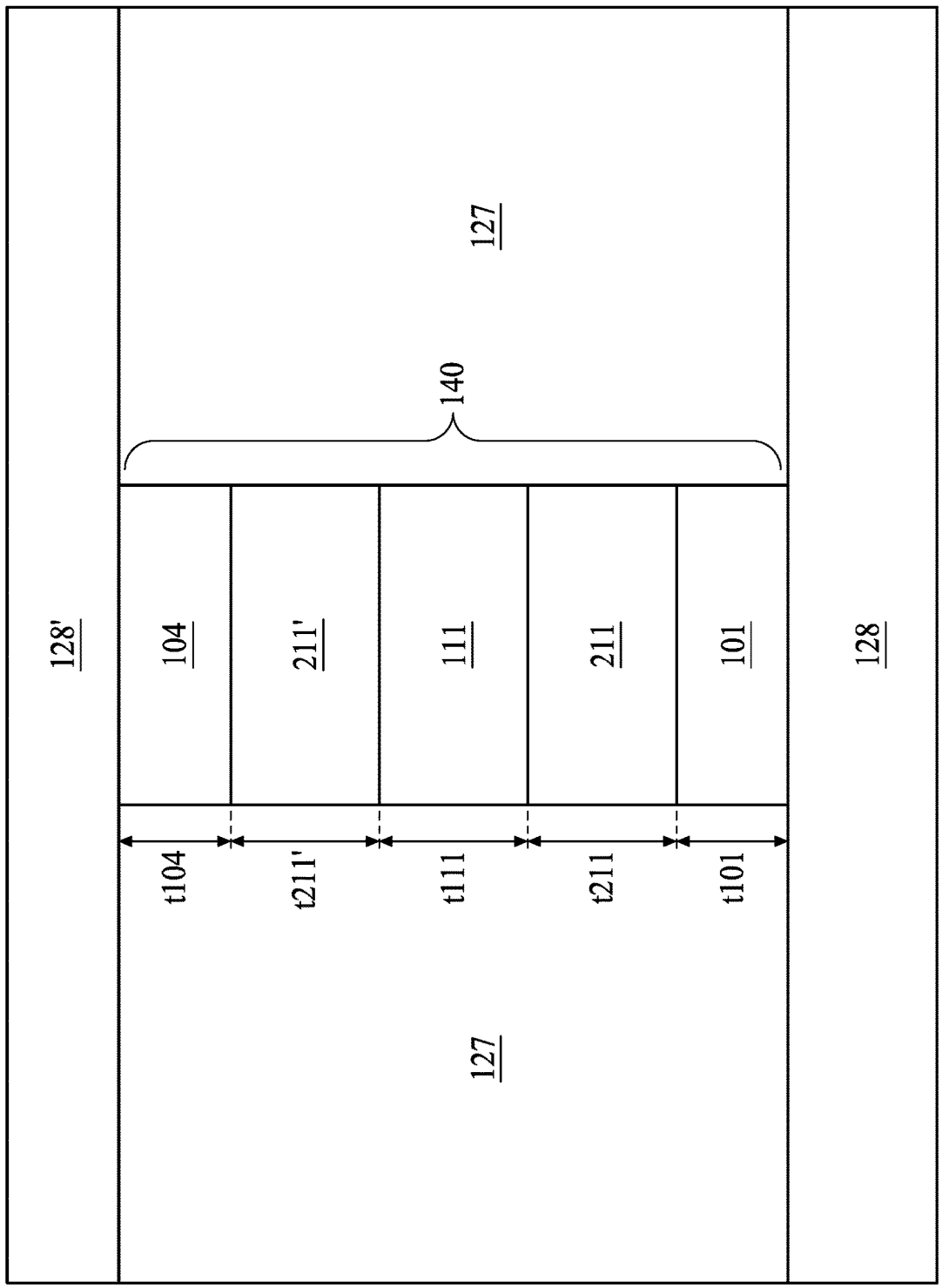
FIG. 2A is a cross section of a phase change memory structure, in accordance with some embodiments of the present disclosure.

Referring to FIG. 2A, FIG. 2A is a cross section of a phase change memory structure. In some embodiments, the phase change memory structure may include the phase change memory stack 140 disposed between the $N^{th}$ ILD 128 and the $(N+1)^{th}$ ILD 128'. The phase change memory stack 140 is surrounded by the dielectric layer 127. The phase change memory stack 140 includes the bottom electrode 101 disposed above the $N^{th}$ ILD 128, a first phase change material 211 contacting a top surface of the bottom electrode 101, a first switch 111 disposed above a top surface of the phase change material 211, a second phase change material 211' disposed above a top surface of the first switch 111, and the top electrode 104 disposed between a top surface of the second phase change material 211' and the bottom surface of the $(N+1)^{th}$ ILD 128'.

In some embodiments, the first switch 111 has a high resistance under voltages below a threshold voltage value of the first switch 111. If an applied voltage exceeds the threshold voltage value of the first switch 111, the resistance of the first switch 111 becomes significantly lower. In some embodiments, a thickness t111 of the first switch 111 is in a range of from 20 Angstrom to 500 Angstrom. If the thickness t111 of the first switch 111 is thinner than 20 Angstrom, film thickness uniformity of the manufactured switches may be difficult to control during deposition. If the thickness t111 of the first switch 111 is thicker than 500 Angstrom, subsequent operations are likely to face high aspect ratio problems, for example, while forming a through-layer via.

In some embodiments, the first switch 111 may include chalcogenide materials including, but not limited to, one or more of As, Ge, and Se, e.g., which may be AsGeSe, N doped AsGeSe, Si doped AsGeSe, InAsGeSe, or stoichiometric materials. In some embodiments, the first switch 111 may include superlattice structure, which will be subsequently described in FIG. 6A of present disclosure. In some embodiments, a thickness of the bottom electrode 101 or the top electrode 104 is in a range of from 20 Angstrom to 500 Angstrom. If the thickness t101 or t104 is thinner than 20 Angstrom, film thickness uniformity of the manufactured bottom electrode 101 may be difficult to control during metal formation. If the thickness t101 or t104 is thicker than 500

Angstrom, subsequent operations are likely face high aspect ratio problems, for example, while forming a through-layer via.

As demonstrated in FIG. 2A, having two phase change materials arranged in series could greatly reduce failure rate of the phase change memory structure. For instance, if the first phase change material 211 fails during operation, the second phase change material 211', which arranged in series with the first phase change material 211, could still function normally so that the entire memory cell, mainly composed of phase change memory stack 140, is not counted a failed cell. Still referring to FIG. 2A, both the materials of the first phase change material 211 and the second phase change material 211' have two distinct metastable phases, e.g. crystalline and amorphous, related to different resistivities. In some embodiments, the first phase change material 211 and the second phase change material 211' may include commonly used chalcogenide materials including, but not limited to, one or more of Ge, Te, and Sb, e.g., which may be GeSbTe, N doped GeSbTe, Si doped GeSbTe, InGeSbTe, or stoichiometric materials. In some embodiments, the first phase change material 211 may include superlattice structure. In some embodiments, the second phase change material 211' may include superlattice structure. In some embodiments, the first phase change material 211 has the same material with the second phase change material 211'. In some other embodiments, the first phase change material 211 has different material with the second phase change material 211'. In some embodiments, a thickness t211 of the first phase change material 211 is in a range of from 20 Angstrom to 500 Angstrom. If the thickness t211 of the first phase change material 211 is thinner than 20 Angstrom, film thickness uniformity of the manufactured phase change materials may be difficult to control during deposition. If the thickness t211 of the first phase change material 211 is thicker than 500 Angstrom, subsequent operations are likely to face high aspect ratio problems, for example, while forming a through-layer via. In some embodiments, the second phase change material 211' has a thickness in a range similar to the first phase change material 211. In some embodiments a thickness t211' of the second phase change material 211' is different from the thickness t211 of the first phase change material 211. While in some embodiments, the thickness t211 is identical with the thickness t211'.

In some embodiments, the first phase change material 211 and the second phase change material 211' can switch between distinct metastable phases by altering Joule heat provided by the bottom electrode 101 and/or the top electrode 104. In some embodiments, the top electrode 104 and/or the bottom electrode 101 is selected to possess a suitable thermal conductivity, or are designed to possess heat-retention structures, in order to effectively achieve the phase change temperature.

Figure 2B:
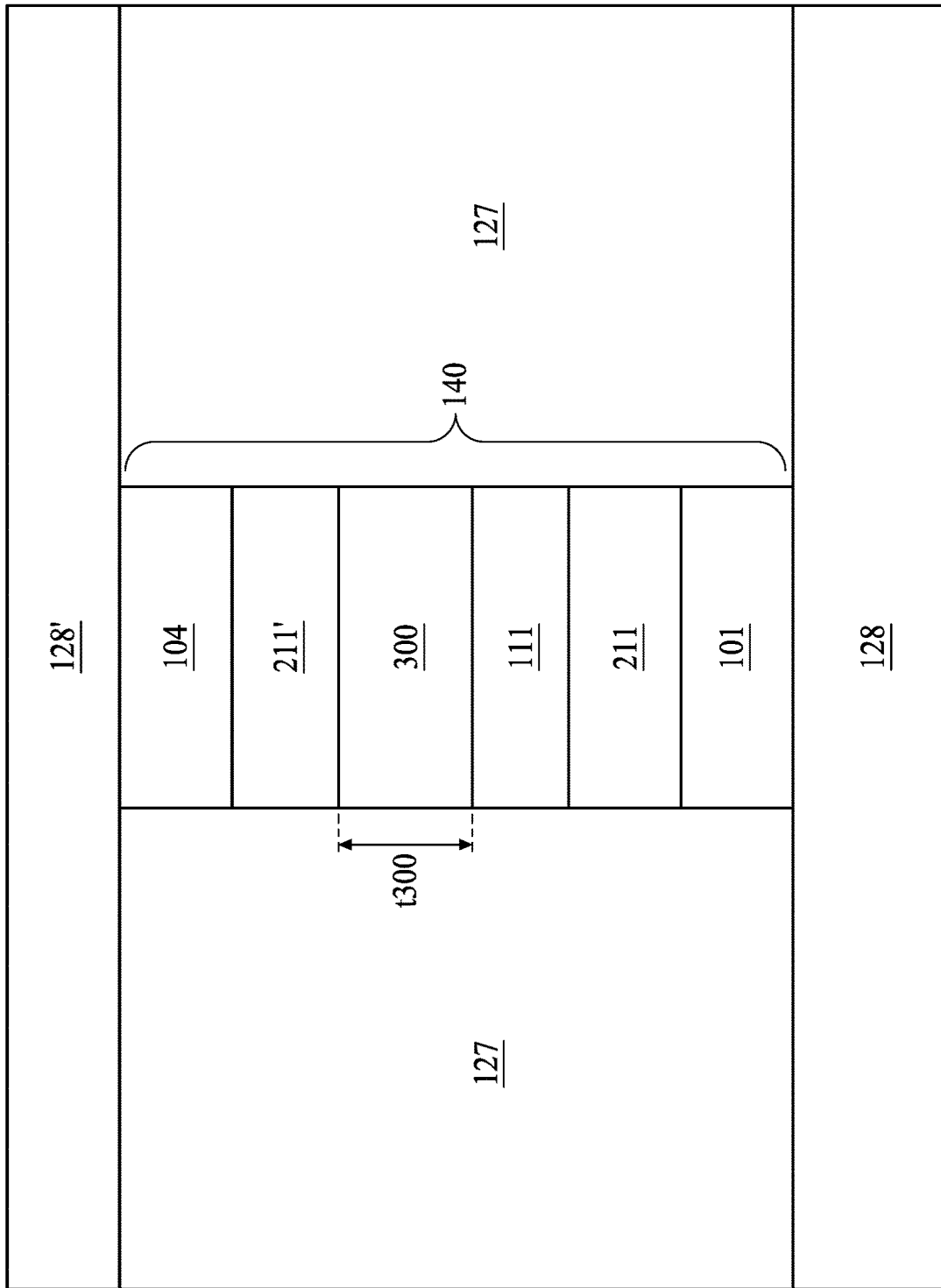
FIG. 2B is a cross section of a phase change memory structure, in accordance with some embodiments of the present disclosure.

In some embodiments, the phase change memory structure illustrated in FIG. 2A may further include one first middle electrode 300 between the top electrode 104 and the bottom electrode 101, as shown in FIG. 2B. Compared to the top electrode 104 and the bottom electrode 101, the first middle electrode 300 is selected to have a different thermal property, for example, a lower heat-retention, from its top and bottom counterparts due to the fact that one end of the middle electrode 300 is in contact with the first switch 111, which does not require elevated temperature as the first or the second change material 211/211' does. In some embodiments, the first middle electrode 300 may be composed of one or more conductive and/or semiconductive materials such as, for example, carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and/or W; conductive metal nitrides including TiN, TaN, WN, and/or TaCN; conductive metal silicides including tantalum silicides, tungsten silicides, nickel silicides, cobalt silicides and/or titanium silicides; conductive metal silicides nitrides including TiSiN and/or WSiN; conductive metal carbide nitrides including TiCN and/or WCN; and conductive metal oxides including $RuO_2$. Referring to FIG. 2B, a cross section of a phase change memory structure, the first middle electrode 300 may be disposed between the first switch 111 and the second phase change material 211'. The first middle electrode 300 may also be spacing between other switch-phase change material interfaces, for example, between the first switch 111 and the first phase change material 211. In some embodiments, a thickness t300 of the first middle electrode 300 is in a range of from 20 Angstrom to 500 Angstrom. The criticality of the thickness t300 of the first middle electrode 300 is similar to the thickness t101 of the bottom electrode 101, as previously discussed in FIG. 2A.

Referring FIG. 2C, the phase change memory structure illustrated in FIG. 2A may further include multiple middle electrodes between the top electrode 104 and the bottom electrode 101. For example, the first middle electrode 300 is spacing between the first phase change material 211 and the first switch 111; while a second middle electrode 300' is disposed between the first switch 111 and the second phase change material 211'. In some embodiments, a thickness t300' of the second middle electrode 300' is in a range similar to the thickness t300 of the first middle electrode 300.

Referring to FIG. 3A, FIG. 3A is a cross section of a phase change memory structure. The phase change memory structure may include the phase change memory stack 140 disposed between the $N^{th}$ ILD 128 and the $(N+1)^{th}$ ILD 128'. The phase change memory stack 140 is surrounded by the dielectric layer 127. In some embodiments, the phase change memory stack 140 includes the bottom electrode 101 disposed above the $N^{th}$ ILD 128, the first phase change material 211 contacting a top surface of the bottom electrode 101, a first switch 111 disposed above a top surface of the first phase change material 211, a second phase change material 211' disposed above a top surface of the first switch 111, a second switch 111' disposed above a top surface of the second phase change material 211', and the top electrode 104 disposed between a top surface of the second switch 111' and the bottom surface of the $(N+1)^{th}$ ILD 128'.

In some embodiments, the phase change memory stack 140 may further include one or more phase change materials and/or one or more switches between the top electrode 104 and the second switch 111'. In some embodiments, the first switch 111 and the second switch 111' have high resistance under voltages below thresholds voltage value of the first switch 111 and the second switch 111' respectively. If an applied voltage exceeds the threshold voltage value, the resistances of the switches become significantly lower. As previously discussed in FIG. 2A, in some embodiments, a thickness t111 of the first switch 111 is in a range of from 20 Angstrom to 500 Angstrom. A thickness t111' of the second switch 111' is in a range similar to the thickness t111 of the first switch 111. In some embodiments the thickness t111' of the second switch 111' is different from the thickness t111 of the first switch 111. While in some embodiments, the thickness t111 is identical with the thickness t111'.

As previously discussed in FIG. 2A, in some embodiments, a thickness t101 of the bottom electrode 101 is in a range of from 20 Angstrom to 500 Angstrom. A thickness t104 of the bottom electrode 104 is in a range similar to the thickness t101 of the bottom electrode 101. In some embodiments, the first switch 111 and the second switch 111' may include commonly used chalcogenide materials including, but not limited to, one or more of As, Ge, and Se, e.g., which may be AsGeSe, N doped AsGeSe, Si doped AsGeSe, InAsGeSe, or stoichiometric materials. In some embodiments, the first switch 111 may include superlattice structure. In some embodiments, the second switch 111' may include superlattice structure. In some embodiments, a material of first switch 111 is identical to the second switch 111'. In some other embodiments, a material of the first switch 111 is different from the second switch 111'. In some embodiments the thickness t111' of the second switch 111' is different from the thickness t111 of the first switch 111. While in some embodiments, the thickness t111 is identical with the thickness t111'.

Conventionally, only one switch is disposed in one phase change memory structure. Along the path of threshold voltage reduction, thickness of the switch has to be made thinner to an extent that triggers substantial leakage current. Therefore, directly reducing the thickness of the switch to lower the threshold voltage is at the expense of increasing the leakage current. By having at least two switches arranged in series in one phase change memory structure, the properties of the phase change memory structure, such as leakage current or threshold voltage, can be easily tuned by tailoring various kinds of materials and thicknesses of switches. As illustrated in FIG. 3A, the first switch 111 and the second switch 111' can be composed of different materials having different switching properties. In some embodiments, effective threshold voltage can be achieved by having appropriate thicknesses for the first switch 111 and the second switch 111', without sacrificing the device leakage current. For example, the first switch 111 may have a greater threshold voltage while the second switch 111' may have a lower threshold voltage matching with the greater threshold voltage in order to render an effective threshold voltage desired in the phase change memory structure.

As previously discussed in FIG. 2A, having two phase change materials arranged in series could greatly reduce failure rate of the phase change memory structure. Referring to FIG. 3A, both the materials of the first phase change material 211 and the second phase change material 211' have two distinct metastable phases, e.g. crystalline and amorphous, related to different resistivity. In some embodiments, the first phase change material 211 and the second phase change material 211' may include commonly used chalcogenide materials including, but not limited to, one or more of Ge, Te, and Sb, e.g., which may be GeSbTe, N doped GeSbTe, Si doped GeSbTe, InGeSbTe, or stoichiometric materials. In some embodiments, the first phase change material 211 may include superlattice structure. In some embodiments, the second phase change material 211' may include superlattice structure. In some embodiments, the first phase change material 211 has the same material with the second phase change material 211'. In some other embodiments, the first phase change material 211 has different material with the second phase change material 211'. As previously discussed in FIG. 2A, a thickness t211 of the first phase change material 211 is in a range of from 20 Angstrom to 500 Angstrom. In some embodiments, the second phase change material 211' has a thickness in a range similar to the first phase change material 211. In some embodiments the thickness t211' of the second phase change material 211' is different from the thickness t211 of the first phase change material 211. While in some embodiments, the thickness t211 is identical with the thickness t211'.

In some embodiments, the first phase change material 211 and the second phase change material 211' can switch between distinct metastable phases by altering Joule heat provided by the bottom electrode 101 and/or the top electrode 104. As previously discussed in FIG. 2A, the top electrode 104 and/or the bottom electrode 101 is selected to possess a suitable thermal conductivity, or is designed to possess heat-retention structures, in order to effectively achieve the phase change temperature.

Figure 3B:
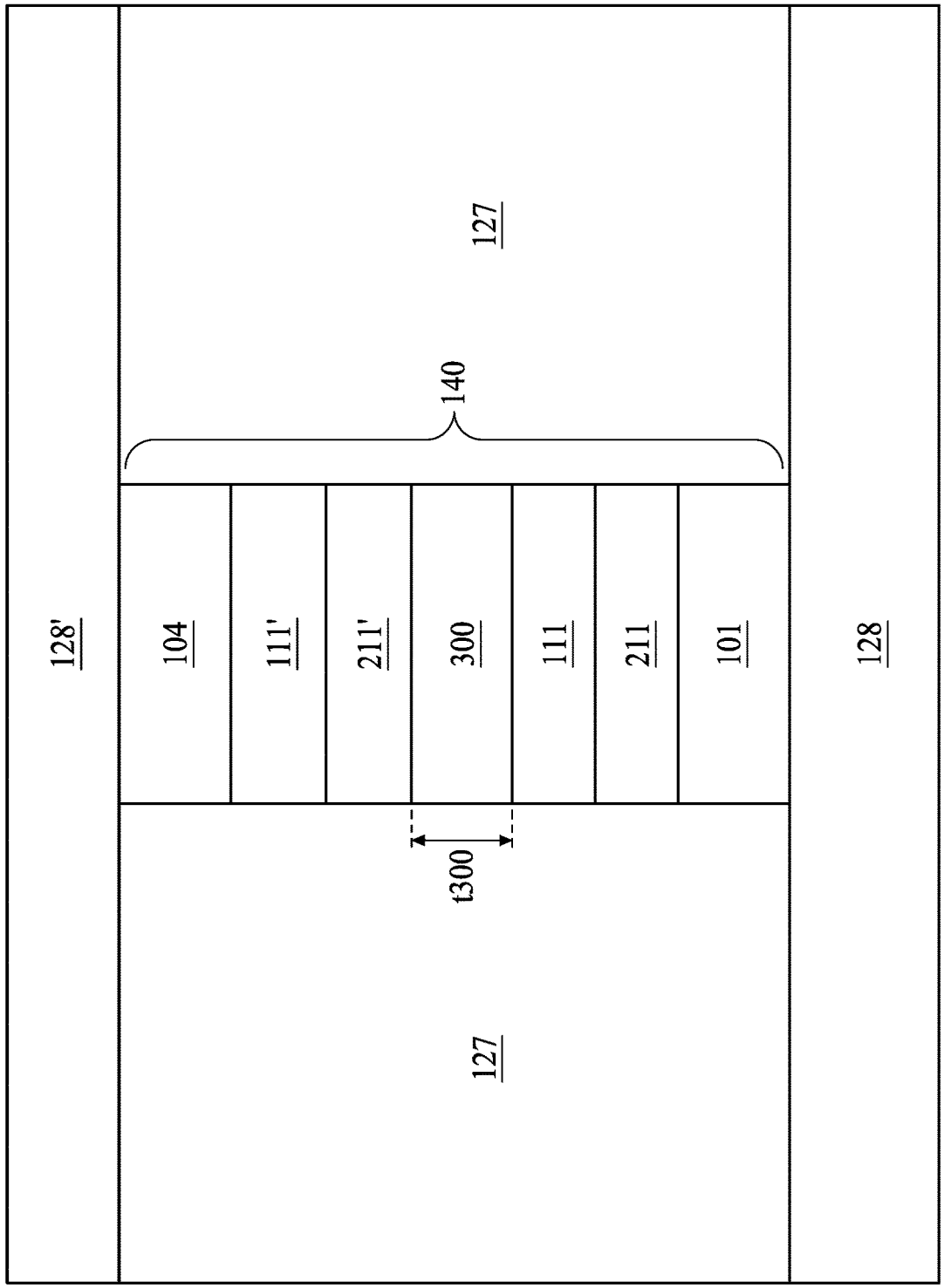
FIG. 3B is a cross section of a phase change memory structure, in accordance with some embodiments of the present disclosure.

In some embodiments, the phase change memory structure illustrated in FIG. 3A may further include one first middle electrode 300 between the top electrode 104 and the bottom electrode 101, as shown in FIG. 3B. As previously discussed in FIG. 2B, compared to the top electrode 104 and the bottom electrode 101, the first middle electrode 300 is selected to have a different thermal property, for example, a lower heat-retention, from its top and bottom counterparts due to the fact that one end of the middle electrode 300 is in contact with the first switch 111, which does not require elevated temperature as the first or the second change material 211/211' does. Referring to FIG. 3B, a cross section of a phase change memory structure, the first middle electrode 300 may be disposed between the first switch 111 and the second phase change material 211'. The first middle electrode 300 may also be spacing between other switch-phase change material interfaces, for example, between the first switch 111 and the first phase change material 211, or between the second phase change material 211' and the second switch 111'. As previously discussed in FIG. 2B, in some embodiments, a thickness t300 of the first middle electrode 300 is in a range of from 20 Angstrom to 500 Angstrom.

Figure 3C:
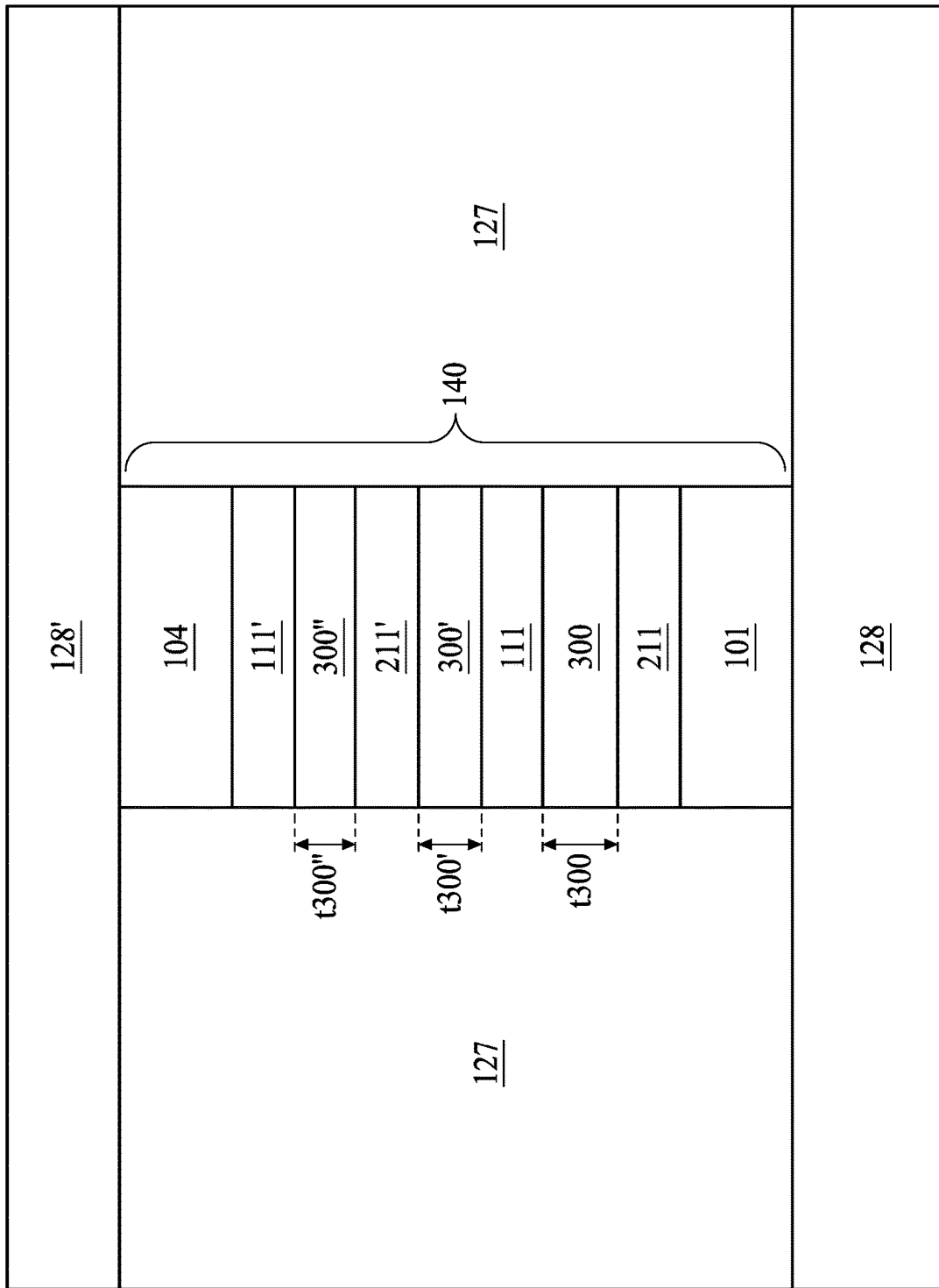
FIG. 3C is a cross section of a phase change memory structure, in accordance with some embodiments of the present disclosure.

Referring to FIG. 3C, the phase change memory structure illustrated in FIG. 3A may further include multiple middle electrodes between the top electrode 104 and the bottom electrode 101. For example, the first middle electrode 300 is spacing between the first phase change material 211 and the first switch 111; a second middle electrode 300' is disposed between the first switch 111 and the second phase change material 211'; while a third middle electrode 300" is disposed between the second switch 111' and the second phase change material 211'. In some embodiments, a thickness t300' of the second middle electrode 300' is in a range similar to the thickness t300 of the first middle electrode 300. In some embodiments, a thickness t300" of the third middle electrode 300" is in a range similar to the thickness t300 of the first middle electrode 300.

Figure 4A:
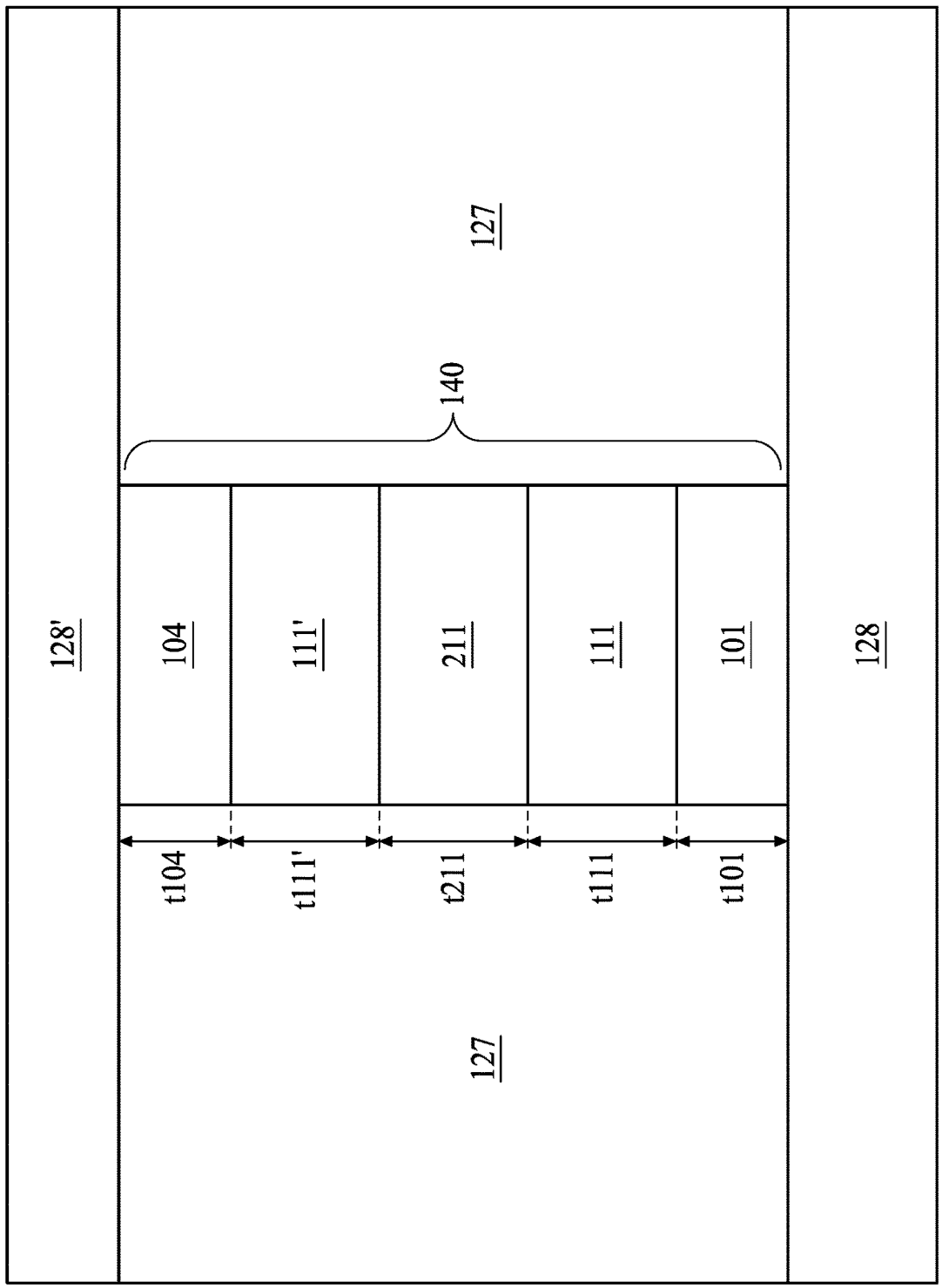
FIG. 4A is a cross section of a phase change memory structure, in accordance with some embodiments of the present disclosure.

Referring to FIG. 4A, FIG. 4A is a cross section of a phase change memory structure. The phase change memory structure may include the phase change memory stack 140 disposed between the $N^{th}$ ILD 128 and the $(N+1)^{th}$ ILD 128'. The phase change memory stack 140 is surrounded by the dielectric layer 127. In some embodiments, the phase change memory stack 140 includes the bottom electrode 101 disposed above the $N^{th}$ ILD 128, the first switch 111 contacting a top surface of the bottom electrode 101, the first phase change material 211 disposed above a top surface of the first switch 111, the second switch 111' disposed above a top surface of the first phase change material 211, and the top electrode 104 disposed between a top surface of the second switch 111' and the bottom surface of the $(N+1)^{th}$ ILD 128'. In some embodiments, the first switch 111 and the second switch 111' have high resistance under voltages below thresholds voltage value of the first switch 111 and the second switch 111' respectively. If an applied voltage exceeds the threshold voltage value, the resistances of the switches become significantly lower. As previously discussed in FIG. 2A, in some embodiments, a thickness t111 of the first switch 111 is in a range of from 20 Angstrom to 500 Angstrom. A thickness t111' of the second switch 111' is in a range similar to the thickness t111 of the first switch 111.

In some embodiments, the first switch 111 and the second switch 111' may include commonly used chalcogenide materials including, but not limited to, one or more of As, Ge, and Se, e.g., which may be AsGeSe, N doped AsGeSe, Si doped AsGeSe, InAsGeSe, or stoichiometric materials. In some embodiments, the first switch 111 may include superlattice structure. In some embodiments, the second switch 111' may include superlattice structure. In some embodiments, the first switch 111 is identical to the second switch 111'. In some other embodiments, the first switch 111 is different from the second switch 111'. Conventionally, only one switch is disposed in one phase change memory structure. Along the path of threshold voltage reduction, thickness of the switch has to be made thinner to an extent that triggers substantial leakage current. Therefore, directly reducing the thickness of the switch to lower the threshold voltage is at the expense of increasing the leakage current. By having at least two switches arranged in series in one phase change memory structure, the properties of the phase change memory structure, such as leakage current or threshold voltage, can be easily tuned by tailoring various kinds of materials and thicknesses of switches. As previously discussed in FIG. 2A, in some embodiments, a thickness t101 of the bottom electrode 101 is in a range of from 20 Angstrom to 500 Angstrom. A thickness t104 of the bottom electrode 104 is in a range similar to the thickness t101 of the bottom electrode 101.

Still referring to FIG. 4A, the first phase change material 211 has two distinct metastable phases, e.g. crystalline and amorphous, related to different resistivity. In some embodiments, the first phase change material 211 may include commonly used chalcogenide materials including, but not limited to, one or more of Ge, Te, and Sb, e.g., which may be GeSbTe, N doped GeSbTe, Si doped GeSbTe, InGeSbTe, or stoichiometric materials. In some embodiments, the first phase change material 211 may include superlattice structure. As previously discussed in FIG. 2A, in some embodiments, a thickness t211 of the first phase change material 211 is in a range of from 20 Angstrom to 500 Angstrom.

In some embodiments, the first phase change material 211 can switch between distinct metastable phases by altering Joule heat provided by the bottom electrode 101 and/or the top electrode 104. As previously discussed in FIG. 2A, the top electrode 104 and/or the bottom electrode 101 is selected to possess a suitable thermal conductivity, or is designed to possess heat-retention structures, in order to effectively achieve the phase change temperature.

Figure 4B:
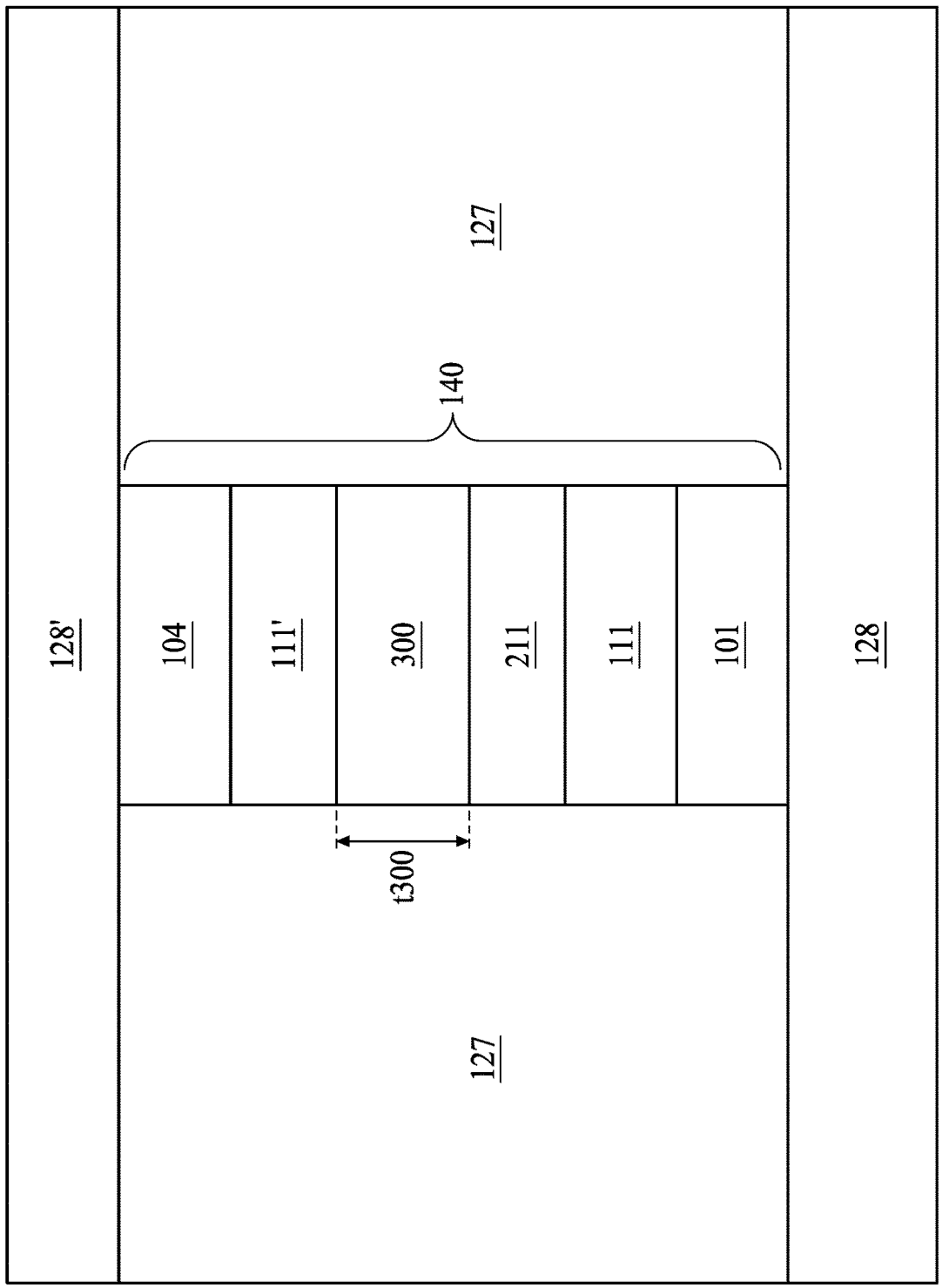
FIG. 4B is a cross section of a phase change memory structure, in accordance with some embodiments of the present disclosure.

In some embodiments, the phase change memory structure illustrated in FIG. 4A may further include one first middle electrode 300 between the top electrode 104 and the bottom electrode 101, as shown in FIG. 4B. As previously discussed in FIG. 2B, compared to the top electrode 104 and the bottom electrode 101, the first middle electrode 300 is selected to have a different thermal property, for example, a lower heat-retention, from its top and bottom counterparts due to the fact that one end of the middle electrode 300 is in contact with the second switch 111', which does not require elevated temperature as the first or the second change material 211/211' does. Referring to FIG. 4B, a cross section of a phase change memory structure, the first middle electrode 300 may be disposed between the second switch 111' and the first phase change material 211. The first middle electrode 300 may also be spacing between other switch-phase change material interfaces, for example, between the first phase change material 211 and the first switch 111. As previously discussed in FIG. 2B, in some embodiments, a thickness t300 of the first middle electrode 300 is in a range of from 20 Angstrom to 500 Angstrom.

Referring to FIG. 4C, the phase change memory structure illustrated in FIG. 4A may further include multiple middle electrodes between the top electrode 104 and the bottom electrode 101. For example, the first middle electrode 300 is spacing between the first phase change material 211 and the first switch 111; while a second middle electrode 300' is disposed between the second switch 111' and the first phase change material 211. In some embodiments, a thickness t300' of the second middle electrode 300' is in a range similar to the thickness t300 of the first middle electrode 300.

Figure 5A:
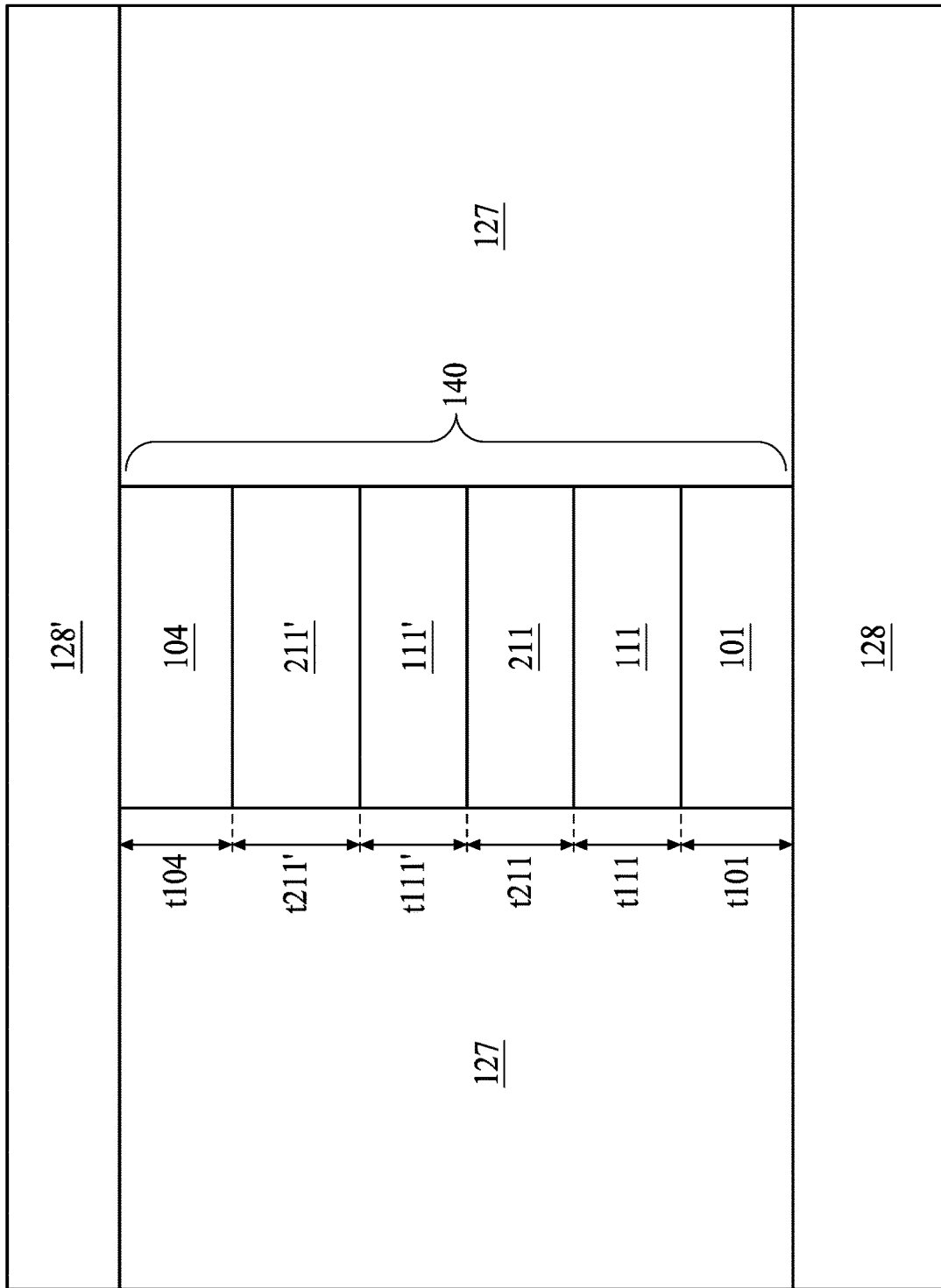
FIG. 5A is a cross section of a phase change memory structure, in accordance with some embodiments of the present disclosure.

Referring to FIG. 5A, FIG. 5A is a cross section of a phase change memory structure. The phase change memory structure may include the phase change memory stack 140 disposed between the $N^{th}$ ILD 128 and the $(N+1)^{th}$ ILD 128'. The phase change memory stack 140 is surrounded by the dielectric layer 127. In some embodiments, the phase change memory stack 140 includes the bottom electrode 101 disposed above the $N^{th}$ ILD 128, the first switch 111 contacting a top surface of the bottom electrode 101, the first phase change material 211 disposed above a top surface of the first switch 111, the second switch 111' disposed above a top surface of the first phase change material 211, a second phase change material 211' disposed above a top surface of the second switch 111', and the top electrode 104 disposed between a top surface of the second phase change material 211' and the bottom surface of the $(N+1)^{th}$ ILD 128'. In some embodiments, the phase change memory stack 140 may further include one or more phase change materials and/or one or more switches between the top electrode 104 and the second switch 111'.

As previously discussed in FIG. 2A, having two phase change materials arranged in series could greatly reduce failure rate of the phase change memory structure. Referring to FIG. 5A, both the materials of the first phase change material 211 and the second phase change material 211' have two distinct metastable phases, e.g. crystalline and amorphous, related to different resistivity. In some embodiments, the first phase change material 211 and the second phase change material 211' may include commonly used chalcogenide materials including, but not limited to, one or more of Ge, Te, and Sb, e.g., which may be GeSbTe, N doped GeSbTe, Si doped GeSbTe, InGeSbTe, or stoichiometric materials. In some embodiments, the first phase change material 211 may include superlattice structure. In some embodiments, the second phase change material 211' may include superlattice structure. In some embodiments, the first phase change material 211 has the same material with the second phase change material 211'. In some other embodiments, the first phase change material 211 has different material with the second phase change material 211'. As previously discussed in FIG. 2A, in some embodiments, a thickness t211 of the first phase change material 211 is in a range of from 20 Angstrom to 500 Angstrom. In some embodiments, the second phase change material 211' has a thickness in a range similar to the first phase change material 211.

In some embodiments, the first phase change material 211 and the second phase change material 211' can switch between distinct metastable phases by altering Joule heat provided by the bottom electrode 101 and/or the top electrode 104. As previously discussed in FIG. 2A, the top electrode 104 and/or the bottom electrode 101 is selected to possess a suitable thermal conductivity, or is designed to possess heat-retention structures, in order to effectively achieve the phase change temperature.

Figure 5B:
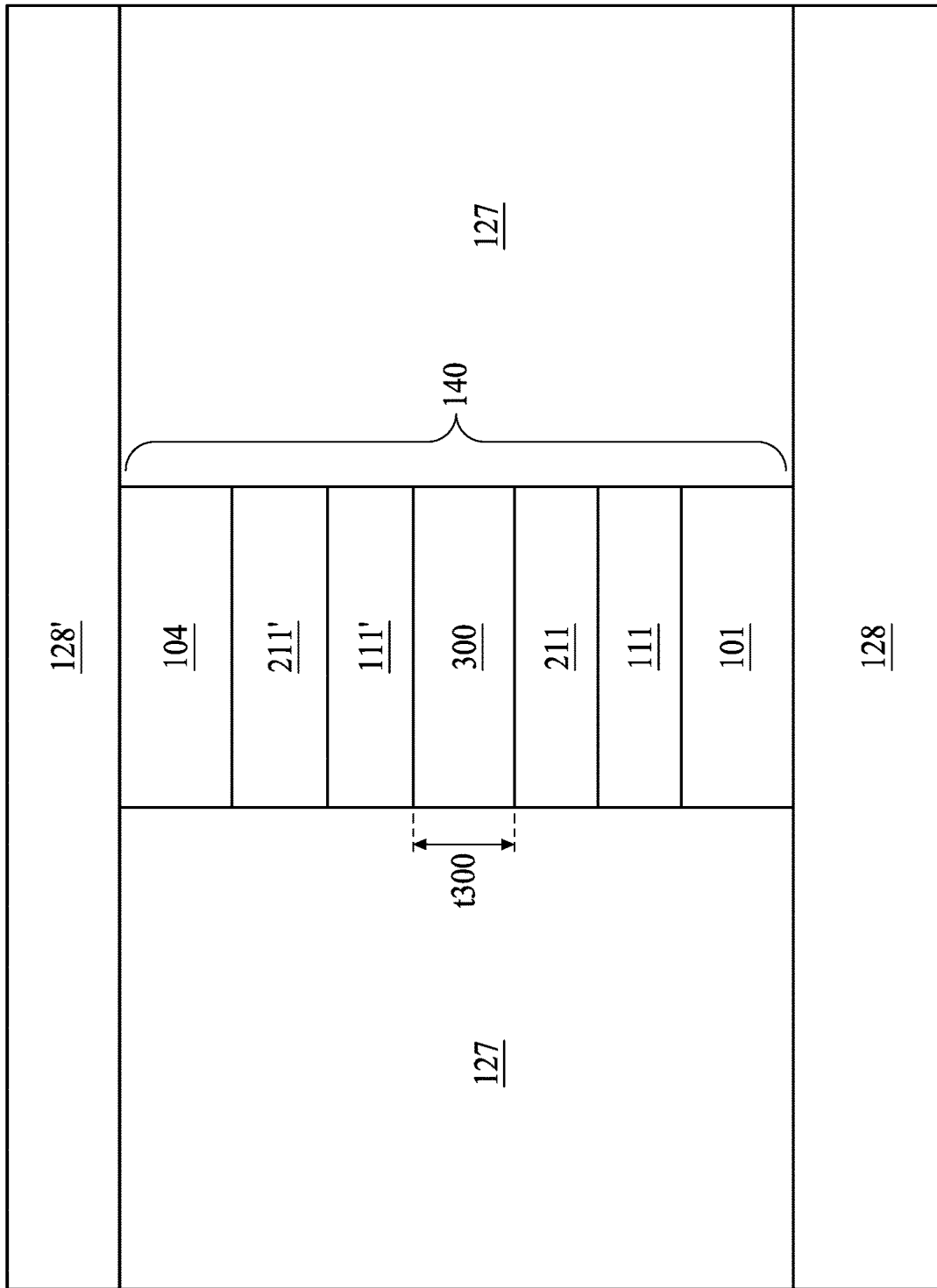
FIG. 5B is a cross section of a phase change memory structure, in accordance with some embodiments of the present disclosure.

In some embodiments, the phase change memory structure illustrated in FIG. 5A may further include one first middle electrode 300 between the top electrode 104 and the bottom electrode 101, as shown in FIG. 5B. As previously discussed in FIG. 2B, compared to the top electrode 104 and the bottom electrode 101, the first middle electrode 300 is selected to have a different thermal property, for example, a lower heat-retention, from its top and bottom counterparts due to the fact that one end of the middle electrode 300 is in contact with the second switch 111', which does not require elevated temperature as the first or the second change material 211/211' does. Referring to FIG. 5B, a cross section of a phase change memory structure, the first middle electrode 300 may be disposed between the second switch 111' and the first phase change material 211. The first middle electrode 300 may also be spacing between other switch-phase change material interfaces, for example, between the first switch 111 and the first phase change material 211, or between the second phase change material 211' and the second switch 111'. As previously discussed in FIG. 2B, in some embodiments, a thickness t300 of the first middle electrode 300 is in a range of from 20 Angstrom to 500 Angstrom.

Figure 5C:
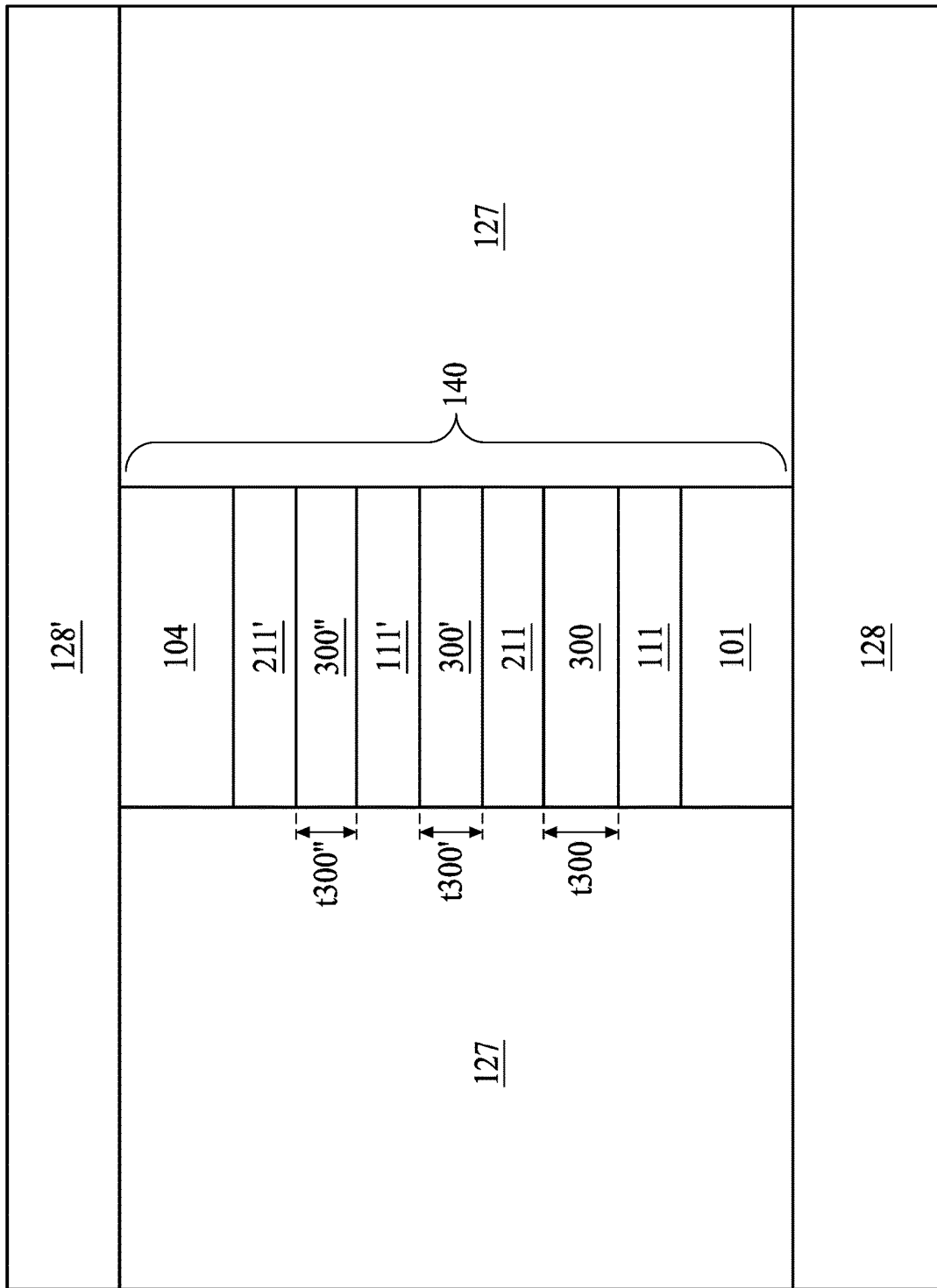
FIG. 5C is a cross section of a phase change memory structure, in accordance with some embodiments of the present disclosure.

Referring to FIG. 5C, the phase change memory structure illustrated in FIG. 5A may further include multiple middle electrodes between the top electrode 104 and the bottom electrode 101. For example, the first middle electrode 300 is spacing between the first phase change material 211 and the first switch 111; a second middle electrode 300' is disposed between the second switch 111' and the first phase change material 211; while a third middle electrode 300" is disposed between the second switch 111' and the second phase change material 211'. In some embodiments, a thickness t300' of the second middle electrode 300' is in a range similar to the thickness t300 of the first middle electrode 300. In some embodiments, a thickness t300" of the third middle electrode 300" is in a range similar to the thickness t300 of the first middle electrode 300.

Figure 6A:
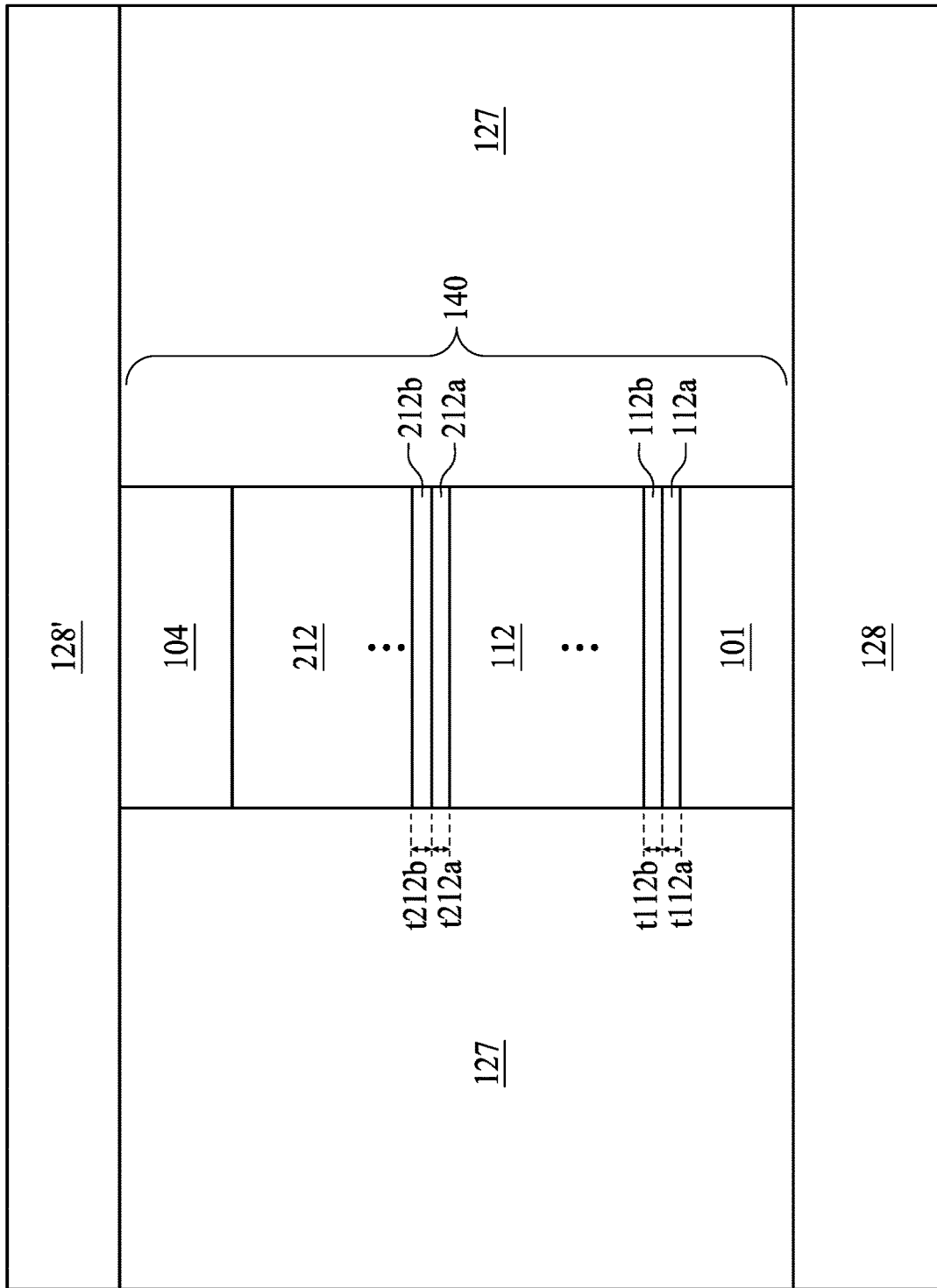
FIG. 6A is a cross section of a phase change memory structure, in accordance with some embodiments of the present disclosure.

Referring to FIG. 6A, FIG. 6A is a cross section of a phase change memory structure. The phase change memory structure may include the phase change memory stack 140 disposed between the $N^{th}$ ILD 128 and the $(N+1)^{th}$ ILD 128'. The phase change memory stack 140 is surrounded by the dielectric layer 127. In some embodiments, the phase change memory stack 140 includes the bottom electrode 101 disposed above the $N^{th}$ ILD 128, a switch superlattice structure 112 contacting a top surface of the bottom electrode 101, a phase change material 212 disposed above a top surface of the switch superlattice structure 112, and the top electrode 104 disposed between a top surface of the phase change material 212 and the bottom surface of the $(N+1)^{th}$ ILD 128'. As previously discussed in FIG. 2A, the top electrode 104 and/or the bottom electrode 101 is selected to possess a suitable thermal conductivity, or is designed to possess heat-retention structures, in order to effectively achieve the phase change temperature. One cycle of the switch superlattice structure 112 includes a first switch 112a and a second switch 112b stacking over the first switch 112a. In some embodiments, the switch superlattice structure 112 may include 1 to 20 cycles. In some embodiments, the switch superlattice structure 112 may include 8 to 10 cycles. In some embodiments, a material of the first switch 112a is different from a material of the second switch 112b in the same superlattice cycle. While in some other embodiments, a material of the first switch 112a is identical to a material of the second switch 112b but only with different dopants.

One cycle of the phase change material 212 includes a first phase change material 212a and a second phase change material 212b stacking over the first phase change material 212a. In some embodiments, the phase change material 212 may include 1 to 20 cycles. In some embodiments, the phase change material 212 may include 8 to 10 cycles. In some embodiments, a material of the first phase change material 212a is different from a material of the second phase change material 212b in the same superlattice cycle. While in some other embodiments, a material of the first phase change material 212a is identical to a material of the second phase change material 212b but only with different dopants. In some embodiments, a thickness t112a of the first switch 112a and a thickness t112b of the second switch 112b are about 10 Angstrom. In some embodiments, a thickness t212a of the first phase change material 212a and a thickness t112b of the second phase change material 212b are about 10 Angstrom.

Figure 6B:
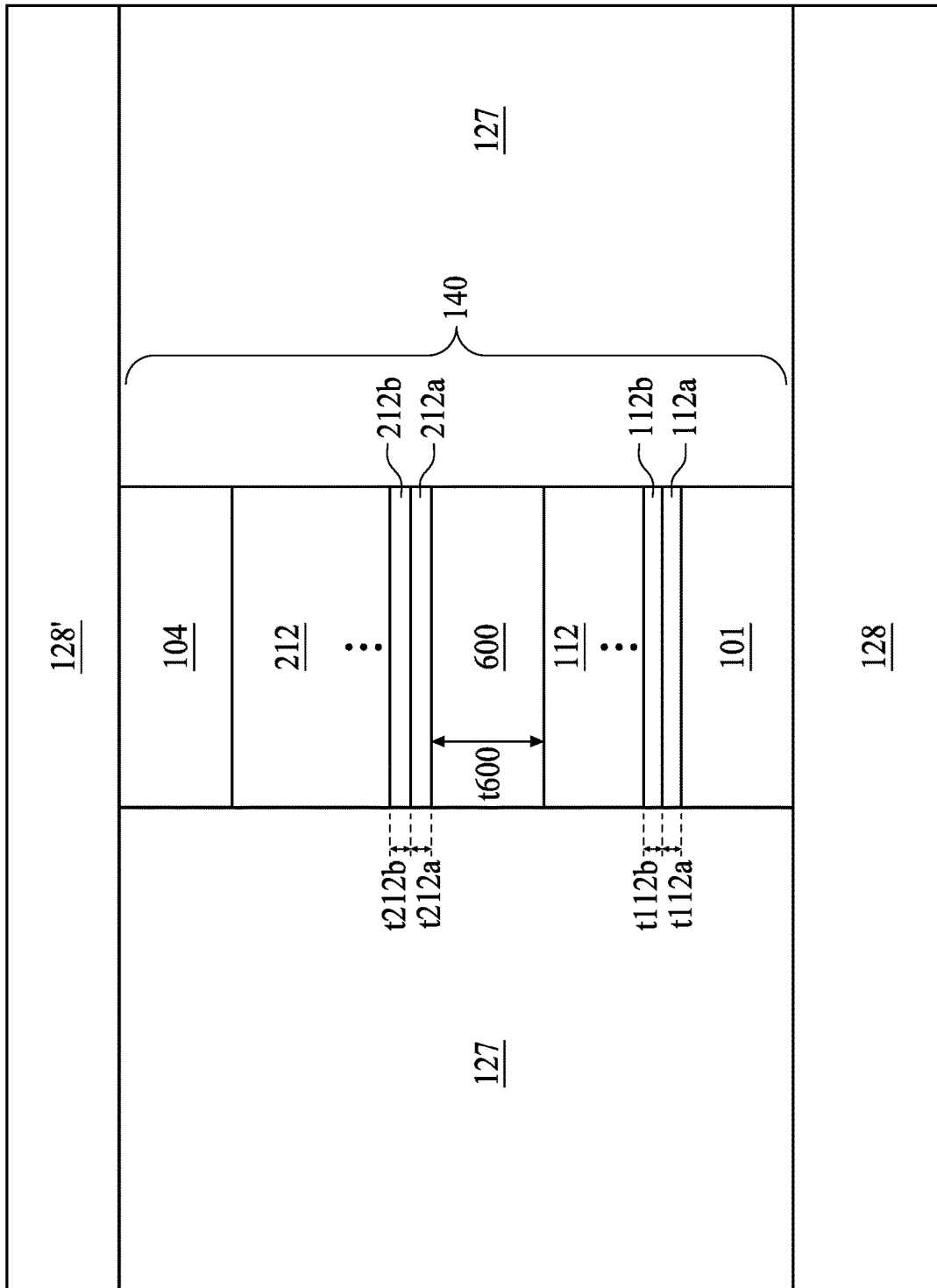
FIG. 6B is a cross section of a phase change memory structure, in accordance with some embodiments of the present disclosure.

The phase change memory structure may further include a middle electrode 600 spacing between the switch superlattice structure 112 and the phase change material 212, as shown in FIG. 6B. As previously discussed in FIG. 2B, compared to the top electrode 104 and the bottom electrode 101, the first middle electrode 600 is selected to have a different thermal property, for example, a lower heat-retention, from its top and bottom counterparts due to the fact that one end of the middle electrode 300 is in contact with the switch superlattice structure 112, which does not require elevated temperature as the first or the second change material 211/211' does. In some embodiments, a material of the first middle electrode 600 may be similar to the first middle electrode 300 previously discussed in FIG. 2B. In some embodiments, a thickness t600 of the middle electrode 600 is in a range of from 20 Angstrom to 500 Angstrom. The criticality of the thickness t600 of the first middle electrode 600 is similar to the thickness t300 of the first middle electrode 300, as previously discussed in FIG. 2B.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a phase change memory structure, including a bottom electrode, a first phase change material contacting a top surface of the bottom electrode, a first switch over the first phase change material, a second phase change material over the first switch, and a top electrode over the second phase change material.

Some embodiments of the present disclosure provide a phase change memory structure, including a bottom electrode, a first switch contacting a top surface of the bottom electrode, a first phase change material over the first switch, a second switch over the first phase change material, a top electrode over the second switch.

Some embodiments of the present disclosure provide a phase change memory structure, including a bottom electrode, a switch superlattice structure contacting a top surface of the bottom electrode, the switch superlattice structure includes a first switch and a second switch stacking with the first switch wherein a material of the first switch is different from a material of the second switch, a phase change material over the switch superlattice structure, and a top electrode over the phase change material.

What is claimed is:

1. A phase change memory structure, comprising:
   a bottom electrode;
   a first phase change material contacting a top surface of the bottom electrode;
   a first switch over the first phase change material, wherein the first switch has a first threshold voltage;
   a second phase change material over the first switch;
   a top electrode over the second phase change material; and
   a second switch between the second phase change material and the top electrode, wherein the second switch has a second threshold voltage, the first threshold voltage is greater than the second threshold voltage.

2. The phase change memory structure of claim 1, wherein the second switch is doped with silicon.

3. The phase change memory structure of claim 1, further comprising:
   an $N^{th}$ interlayer dielectric (ILD) under the bottom electrode; and
   an $(N+1)^{th}$ ILD over the top electrode, wherein N is an integer greater than zero.

4. The phase change memory structure of claim 1, wherein a thickness of the first phase change material is in a range of from about 20 Angstrom to 500 Angstrom.

5. The phase change memory structure of claim 1, wherein the first phase change material is different from the second phase change material.

6. The phase change memory structure of claim 1, further comprising at least one middle electrode between the top electrode and the bottom electrode, wherein the middle electrode possesses a different heat conductivity from that of the top electrode.

7. The phase change memory structure of claim 1, wherein at least one of the first phase change material and the second phase change material comprises a first superlattice structure.

8. The phase change memory structure of claim 1, wherein the first switch comprises a second superlattice structure.

9. A phase change memory structure, comprising:
   a bottom electrode;
   a first switch contacting a top surface of the bottom electrode, wherein the first switch has a first threshold voltage;
   a first phase change material over the first switch;
   a second switch over the first phase change material, wherein the second switch has a second threshold voltage, the first threshold voltage is greater than the second threshold voltage; and
   a top electrode over the second switch.

10. The phase change memory structure of claim 9, further comprising at least one second phase change material between the second switch and the top electrode.

11. The phase change memory structure of claim 9, wherein a material of the first switch is different from a material of the second switch.

12. The phase change memory structure of claim 9, a thickness of the first switch is in a range of from about 20 Angstrom to 500 Angstrom.

13. The phase change memory structure of claim 9, further comprising:
   a first middle electrode between the first switch and the first phase change material; and
   a second middle electrode between the first phase change material and the second switch.

14. The phase change memory structure of claim 9, further comprising:
   an $N^{th}$ interlayer dielectric (ILD) under the bottom electrode; and
   an $(N+1)^{th}$ ILD over the top electrode, wherein N is an integer greater than zero.

15. The phase change memory structure of claim 9, wherein at least one of the first phase change material and the first switch comprises a superlattice structure.

16. The phase change memory structure of claim 9, wherein a thickness of the first switch is different from a thickness of the second switch.

17. A phase change memory structure, comprising:
   a bottom electrode;
   a first switch superlattice structure contacting a top surface of the bottom electrode, wherein the first switch superlattice structure has a first threshold voltage, the first switch superlattice structure comprises:
     a first switch; and
     a second switch stacking with the first switch, a material of the first switch is different from a material of the second switch;
   a phase change material over the switch superlattice structure;
   a second switch superlattice structure over the phase change material, wherein the second switch superlattice structure has a second threshold voltage, the first threshold voltage is greater than the second threshold voltage; and
   a top electrode over the phase change material.

18. The phase change memory structure of claim 17, wherein the phase change material is a phase change material superlattice structure, comprising:
   a first phase change material; and
   a second phase change material stacking with the first phase change material, the first phase change material being different from the second phase change material.

19. The phase change memory structure of claim 18, wherein a thickness of the first phase change material and a thickness of the second phase change material are about 10 Angstrom.

20. The phase change memory structure of claim 17, further comprising a middle electrode between the switch superlattice structure and the phase change material.

* * * * *